United States Patent [19]

Ito

[11] Patent Number: 4,975,875
[45] Date of Patent: Dec. 4, 1990

[54] STATIC RANDOM ACCESS MEMORY WITH TRI-LAYER CONDUCTOR CONSTRUCTION OVER ACCESS TRANSISTORS

[75] Inventor: Shinichi Ito, Kanagawa, Japan
[73] Assignee: Sony Corporation, Tokyo, Japan
[21] Appl. No.: 406,598
[22] Filed: Sep. 13, 1989
[30] Foreign Application Priority Data
  Sep. 13, 1988 [JP] Japan .................. 63-229481
[51] Int. Cl.$^5$ .................................... G11C 5/06
[52] U.S. Cl. ...................... 365/72; 365/154; 357/41; 357/54; 357/59
[58] Field of Search ........... 365/72, 154; 357/41, 357/59 G, 59 J, 54

[56] References Cited
U.S. PATENT DOCUMENTS
4,631,705 12/1986 Honda ............................ 365/154
4,744,056 5/1988 Yu et al. ......................... 357/41
4,853,894 8/1989 Yamanaka et al. .............. 365/154

Primary Examiner—Joseph E. Clawson, Jr.
Attorney, Agent, or Firm—Hill, Van Santen, Steadman & Simpson

[57] ABSTRACT

The present invention relates to a semiconductor memory device and more particularly to a static random access memory (S-RAM), which is of a structure in which the bit lines electrically connected with the diffusion regions of the access transistors are arranged so as not to be broken.

According to the present invention, the bit lines are first led out to the positions over the gate electrodes of the access transistors and then extended opposite to each other in the extended direction of a pair of bit lines so as to be connected with these bit lines.

By virtue of such an arrangement, it is made achievable to increase packaging density and improve reliability on the device.

8 Claims, 8 Drawing Sheets

STATIC RANDOM ACCESS MEMORY WITH TRI-LAYER CONDUCTOR CONSTRUCTION OVER ACCESS TRANSISTORS

BACKGROUND OF THE INVENTION

1. Field of the Invention

The present invention relates to a semiconductor memory device and more particularly to a static random access memory (Static RAM).

2. Description of the Prior Art

An S-RAM, such as a high resistance load type S-RAM, for example, has memory cells each thereof being constituted, as shown in FIG. 6 showing the equivalent circuit of one memory cell, of a flip-flop circuit formed of a pair of an inverter consisting of a high resistance $R_1$ and a MIS transistor $Q_1$ and an inverter consisting of a high resistance $R_2$ and a MIS transistor $Q_2$, output of one inverter thereof being connected with input of the other inverter, and access transistors $Q_3$ and $Q_4$ made up of a pair of MIS transistors, in which the pair of access transistors $Q_3$ and $Q_4$ are connected with a pair of bit lines DL and $\overline{DL}$. Reference character WL denotes a work line and $V_{cc}$ denotes a power supply terminal.

In semiconductor memory devices of the described type, there is one disclosed in Japanese Laid-open Patent Publication No. 62-293668, in which increase in packaging density is achieved by forming gate electrodes and word lines on a conductive layer as the first layer of a multiple layer wiring structure, forming grounding lines on a conductive layer as the second layer of the same, and forming resistor elements on a conductive layer as the third layer of the same. While these first, second, and third conductive layers are formed, for example, of polycrystalline silicon layers, and leads are let out as the bit lines DL and e,ovs/DL/ by means of wiring metallic layers, for example, Al metallic layers, provided on the topmost layer of the polycrystalline silicon conductive layers in the multiple layer structure, the bit lines on the topmost layer are electrically connected with the second conductive layer, formed under the topmost layer, electrically led out from diffusion regions serving as source regions of the access transistors $Q_3$ and $Q_4$. Therefore, there has been a roblem of lowered reliability on the device because of the connections being formed where there are differences in level, which may lead to such trouble as breaking of wire, and there has also been a demand for obtaining increased packaging density.

SUMMARY OF THE INVENTION

It is a principal object of the present invention to achieve increase in packaging density and improvement of reliability on the device. To achieve the object, an S-RAM according to the present invention is arranged such that first wiring layers connected with diffusion regions of a pair of access transistors as the constituents of the S-RAM are extended to the positions over the electrondes of the access transistors in its memory cell and a memory cell adjoining thereto and led out therefrom opposite to each other in the extended direction of a pair of bit lines to be connected with these bit lines.

DETAILED DESCRIPTION OF THE PREFERRED EMBODIMENTS

Figure 1:
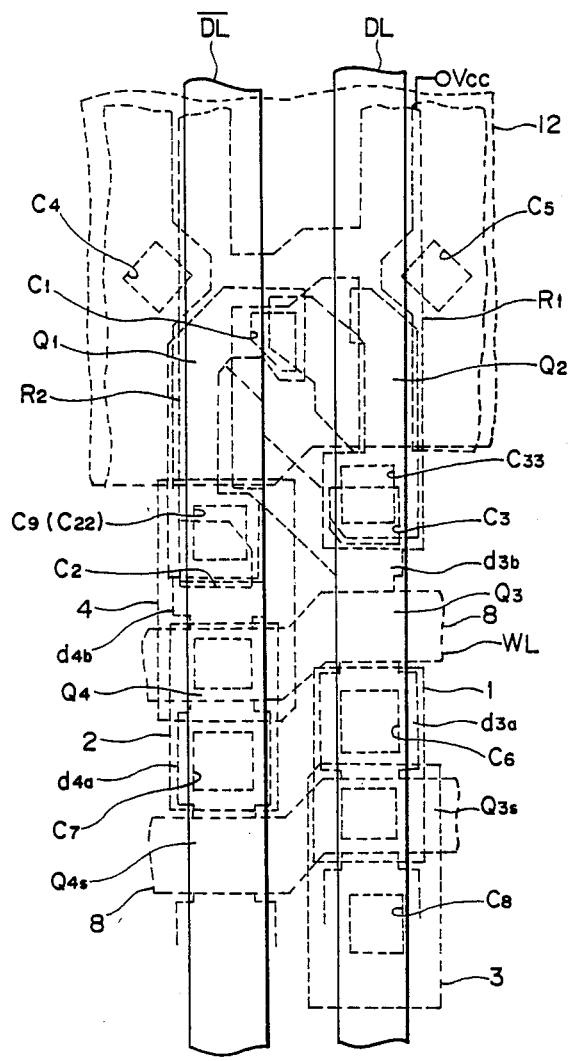
FIG. 1 is an enlarged schematic plan view of an example of the device of the present invention.
Figure 2:
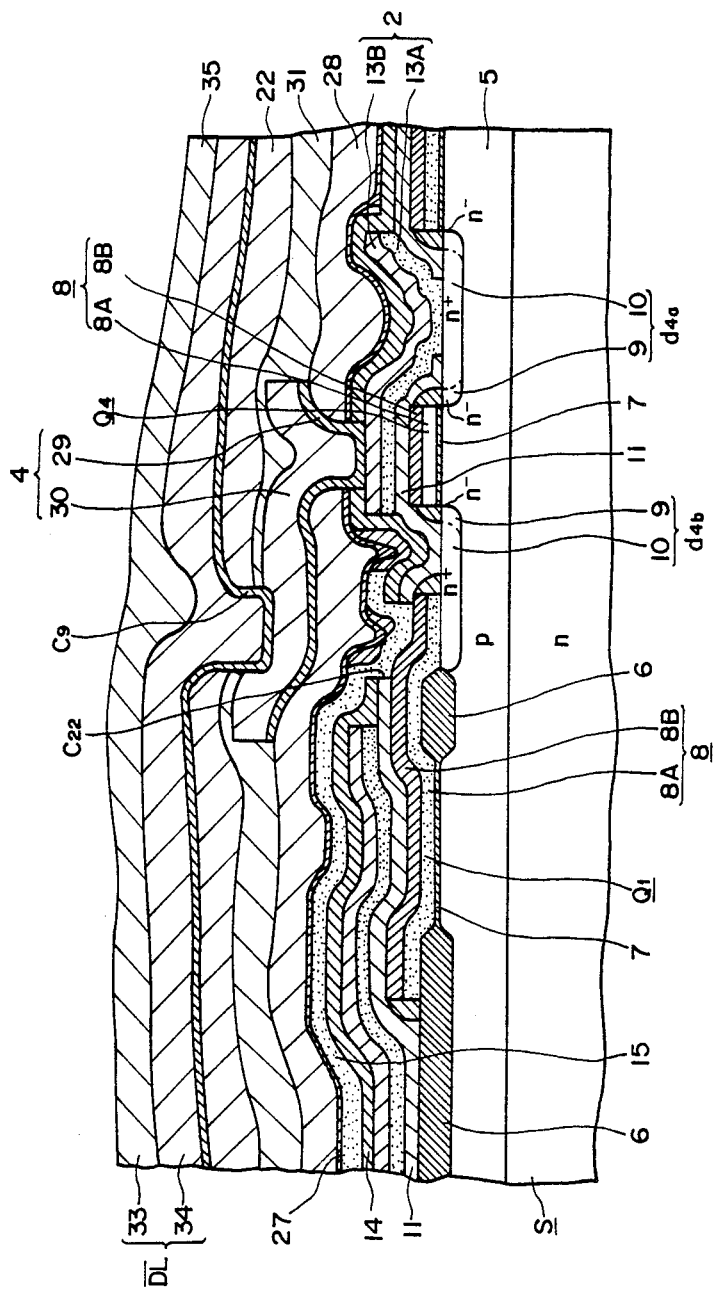
FIG. 2 is an enlarged schematic sectional view of the principal portion of the same.
Figure 3:
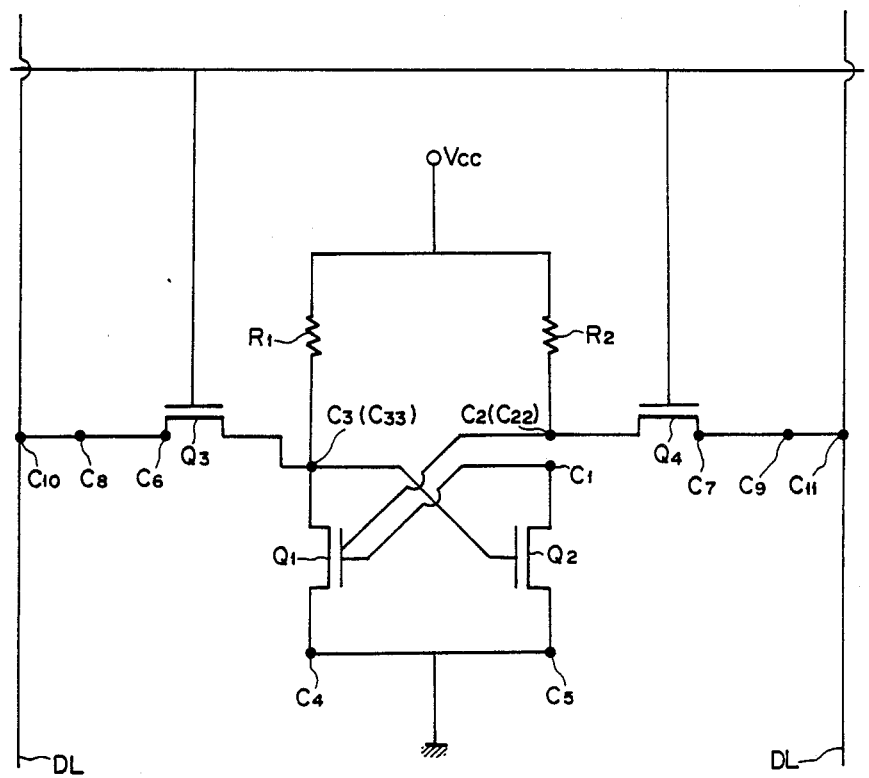
FIG. 3 is a connection diagram showing arrangement of the device of the present invention.

In a semiconductor memory device having a memory cell, as shown in its enlarged schematic plan view of FIG. 1, an enlarged schematic sectional view of its principal portion of FIG. 2, and in its structural connection diagram of FIG. 3, comprising a flip-flop circuit constructed of a pair of MIS transistors (driver transistors) $Q_1$ and $Q_2$ and a pair of access transistors, MIS transistors to be concrete, $Q_3$ and $Q_4$, the pair of access transistors $Q_3$ and $Q_4$ being connected with a pair of bit lines DL and $\overline{DL}$, the present invention is provided with first wiring layers 1 and 2 connected with diffusion regions (for exampe, drain regions) $d_{3a}$ and $d_{4a}$ of the access transistors $Q_3$ and $Q_4$ formed of the pair of MIS transistors, and extended to the positions over gate electrodes of access transistors, or, to be concrete, over the gate electrode of one of the access transistors of one memory cell, for example, the transistor $Q_4$, and over the gate electrode of the access transistor $Q_{3S}$ of another memory cell adjoining the access transistor $Q_3$ of the former memory cell. Further, the present invention is provided with second wiring layers 3 and 4 which are connected with the pair of first wiring layers 1 and 2 at the position over the gate electrodes of the access transistors $Q_{3S}$ and $Q_4$ and led out therefrom along the pair of bit lines DL and $\overline{DL}$ but in the directions opposite to each other to be connected with the pair of bit lines DL and $\overline{DL}$.

According to the arrangement of the present invention as described above, the connections of the bit lines DL and e,ovs/DL/ with the diffused regions $d_{3a}$ and $d_{4a}$ are achieved by means of the first wiring layers and the second wiring layers 1 and 3, and 2 and 4. In this case, connections between the first wiring layers 1 and 2 and the second wiring layers 3 and 4 are achieved at the positions over the gate electrodes of the access transistors $Q_{3S}$ and $Q_4$, and these wiring layers are led out to go in the opposite directions with respect to the pair of access transistors $Q_{3S}$ and $Q_4$, that is, to go counter to each other, and thereby, the distance between their arrangement can be made sufficiently small without causing shorting therebetween. More particularly, the width can be made smaller than where the second wiring layers 3 and 4 are juxtaposed, and therefore, increased packaging density can be achieved. Further, since the connections between the regions 3a and 4b and the respective bit lines DL and $\overline{DL}$ are adapted to the achieved through the first wiring layers 1 and 2 and the second wiring layers 3 and 4, differences in level at the connecting portions between the wiring layers can be made smaller so that the cause of lowered reliability on the device due to such a thing as breakage of the wiring at stepped portions can be effectively avoided.

The device according to the present invention shown in FIG. 1 to FIG. 3 inclusive of the manufacturing method of the same will be described below in detail also referring to FIG. 4 and FIG. 5 for ease of understanding.

Figure 4B:
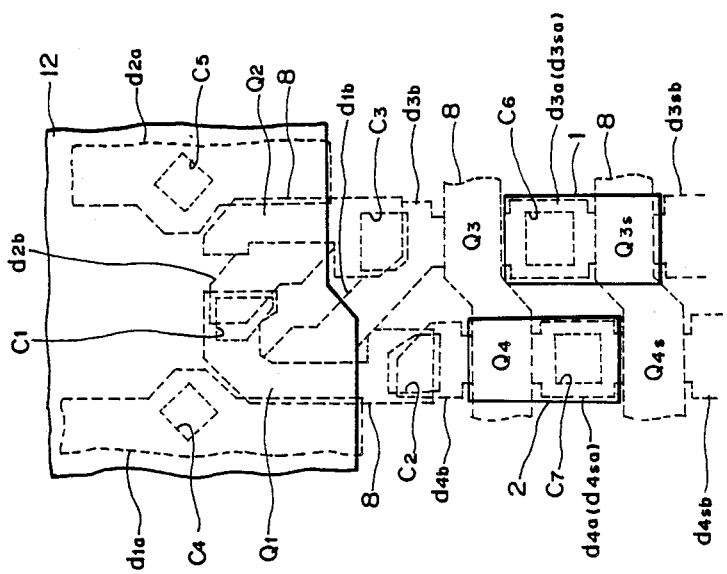
FIGS. 4A to 4D are enlarged schematic plan views of the device of the present invention in the manufacturing steps.
Figure 4A:
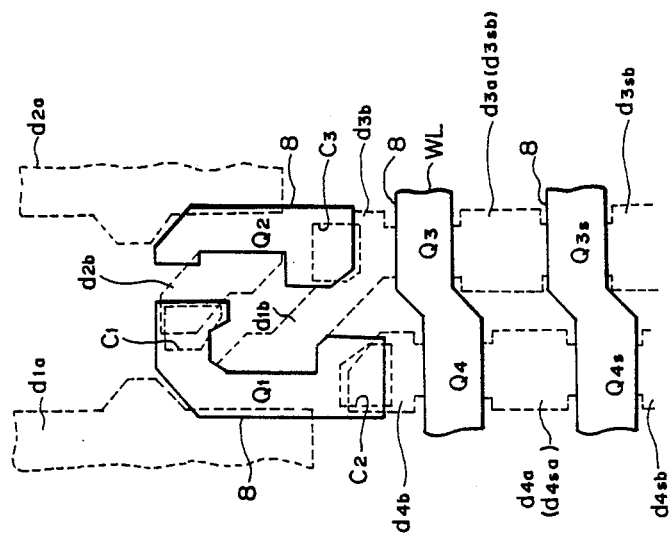
Figure 4D:
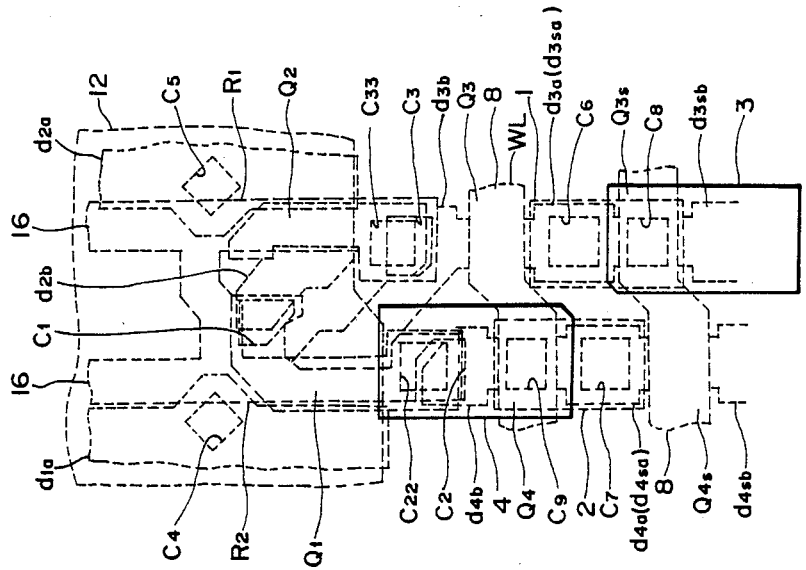
Figure 4C:
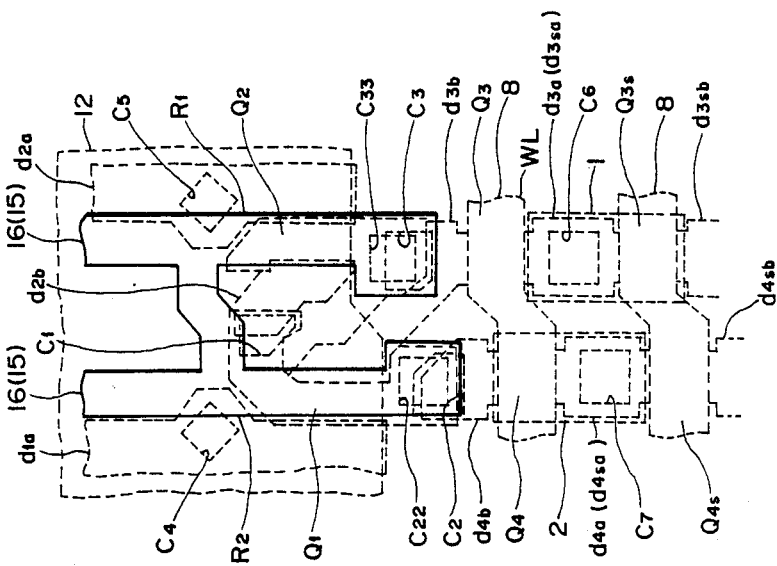
Figure 5A:
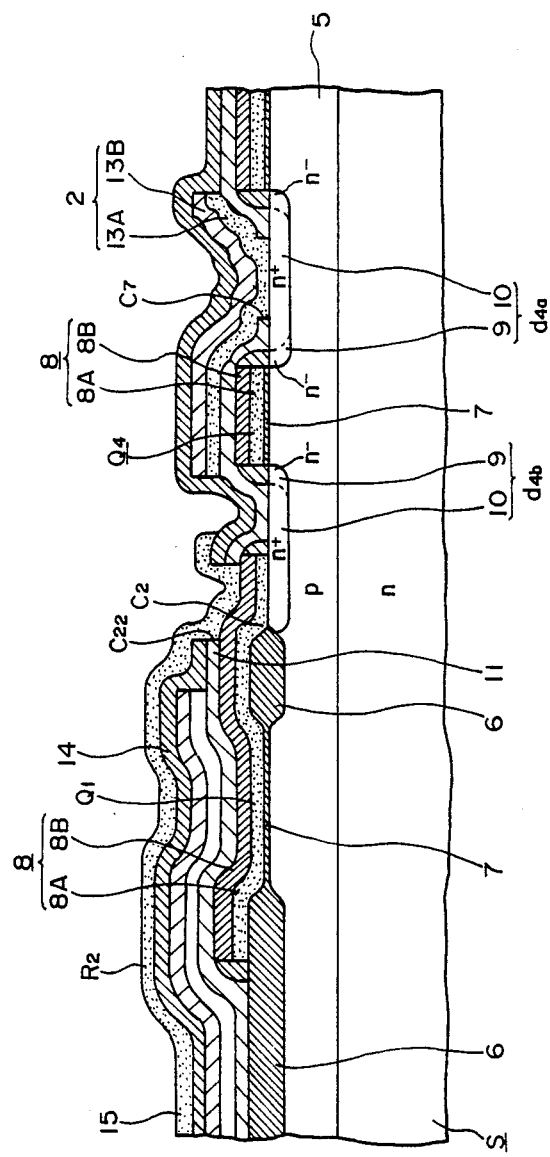
FIGS. 5A and 5B are enlarged schematic sectional views of the principal part in the manufacturing steps.
Figure 5B:
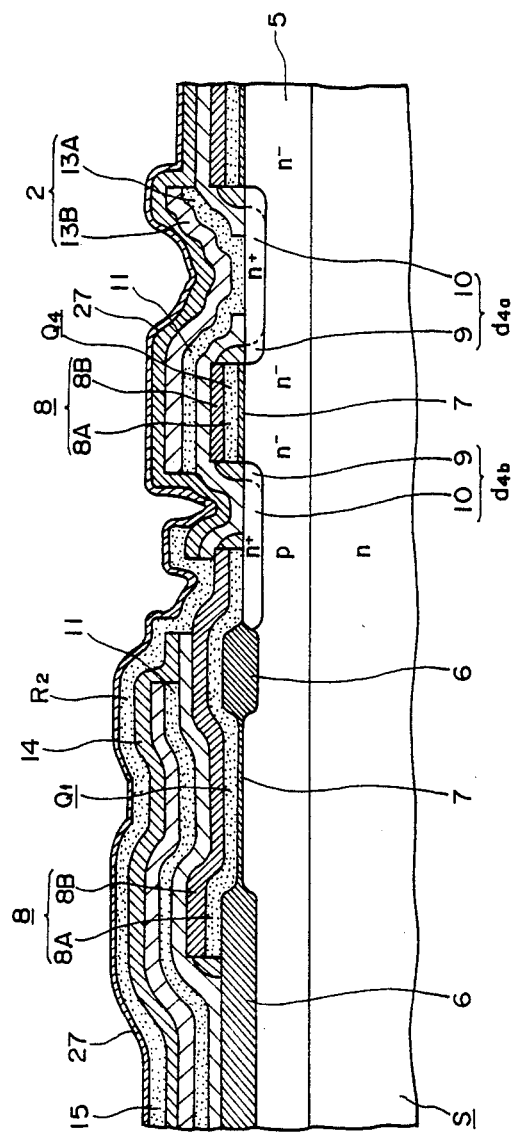

FIG. 4A to FIG. 4D are enlarged schematic plan views showing one memory cell of a high load resistance type S-RAM and a portion where access transistors $Q_{3S}$ and $Q_{4S}$, of an adjoining memory cell, connected to the same bit lines DL and $\overline{DL}$ are arranged and FIG. 5A and FIG. 5B are enlarged schematic sectional views of the device taken along the line of arrangement of the transistors $Q_1$ and $Q_4$ of FIG. 4 in each manufacturing step.

The present example is arranged, as shown in FIG. 5, such that, on one principal plane of a semiconductor substrate S of a first conduction type, for example, n-type, is formed a well region 5 of the other conductive type, for example, p-type, and on the well region 5 are formed transistors for each memory cell.

At the so-called field portions on the semiconductor substrate S where there are formed no circuit elements, i.e., transistors, there are provided thick $SiO_2$ field insulating layers 6 formed, for example, by thermal oxidization.

At the gate portions of the transistors as the circuit elements, where there are formed no field insulating layers 6, there are deposited gate insulating layers 7, for example, of a thin $SiO_2$ oxidized film in desired patterns. Inclusive of the same, there are formed gate electrodes 8 of each of the transistors $Q_1$– $Q_4$ and $Q_{3S}$ and $Q_{4S}$ as shown in FIG. 4A and FIG. 5A. Of these gate electrodes 8, those for the transistors $Q_1$ and $Q_2$ are formed independently of each other, while those for the transistors $Q_3$ and $Q_4$ and those for the transistors $Q_{3S}$ and $Q_{4S}$ are formed in common with each other inclusive of their respective word lines WL.

These gate electrodes 8 are arranged in a so-called polycide structure. More particularly, a first polycrystalline silicon layer 8A of a thickness, for example, of 1000 Å is formed all over the surface and a silicide layer 8B of the refractory metal, for example, of tungsten W of a thickness, for example, of 1000 Å is formed all over the same, and these layers are subjected to pattern etching by RIE (reactive ion etching) or the like, whereby all the gate electrodes 8 are formed simultaneously.

On the surface of the well region 5, at both sides of each of the gate portions of the MIS transistors, there are formed diffusion regions, becoming source and drain regions, $d_{1a}$, $d_{1b}$; $d_{2a}$, $d_{2b}$; $d_{3a}$, $d_{3b}$; $d_{4a}$, $d_{4b}$; $d_{3Sa}$, $d_{3Sb}$; and $d_{4Sa}$, $d_{4Sb}$, by a method, for example, of ion implantation of impurities of n-type, in the present example, with the gate electrodes 8 and field insulating layers 7 used as masks. In the present arrangement, the region $d_{1b}$ for the transistor $Q_1$ and the region $d_{3b}$ for the transistor $Q_3$ are put in connection, and regions $d_{3b}$ and $d_{3Sa}$, and $d_{4a}$ and $d_{4Sa}$, at one side of the transistors $Q_3$ and $Q_{3S}$, and $Q_4$ and $Q_{4S}$, are put in connection, respectively.

Each of the above described diffusion regions, i.e., the source and drain regions of each of the transistors $Q_1$ to $Q_4$ and $Q_{3S}$ and $Q_{4S}$ is formed of a low-impurity-concentration region 9, which is formed on the side close to each gate portion, and a high-impurity-concentration region 10 separated from each gate portion by the region 9 interposed therebetween. The low-impurity-concentration regions 9 are formed, for example, by ion implantation of impurities with gate electrodes used as masks. Further, the high-impurity-concentration regions are formed, after having side walls of $SiO_2$ formed on both sides of the gate electrodes by a known technique, by ion implantation of n-type impurities in high concentration using the side walls as masks and also by means of impurity doping, for example, from the first polycrystalline silicon layers 8A.

Referring to FIG. 4A, reference characters $C_1$, $C_2$, and $C_3$ denote electrical contacts corresponding to the connections denoted by the same reference characters in FIG. 3, of which the contacts $C_1$ and $C_2$ represent ohmic contacts connection extensions at both ends of the gate electrode of the transistor $Q_1$ with the diffusion regions $d_{2b}$ and $d_{4b}$ at one side of the transistors $Q_2$ and $Q_4$, respectively. The contact $C_3$ represents an ohmic contact connecting one end of the gate electrode of the transistor $Q_2$ with the diffusion portions $d_{1b}$ and $d_{3b}$ at one side of each of the transistors $Q_1$ and $Q_3$.

Then, on the entire surface inclusive of the surfaces of the gate electrodes 8 is formed a first interlayer insulating layer 11, which is an $SiO_2$ layer provided, for example, by CVD (chemical vapor deposition).

Then, contact windows are made in the interlayer insulating layer 11 at predetermined positions as shown in FIG. 4B for forming contacts $C_4$ to $C_7$, which are denoted by the same reference characters at corresponding positions in FIG. 3, and a grounding conductive layer 12 is formed, which connects with the diffusion regions $d_{1a}$ and $d_{1b}$ at one side of the transistors $Q_1$ and $Q_2$ through the contacts $C_4$ and $C_5$. Also, second wiring layers 3 and 4 connecting, through the contacts $C_6$ and $C_7$, with the diffusion regions $d_{3a}$ and $d_{4a}$ at one side of the transistors $Q_3$ and $Q_4$ to be connected with the bit lines DL and $\overline{DL}$ are formed such that they extend to the positions over the gate portions of the transistors $Q_{3S}$ and $Q_4$. These grounding conductive layer 12 and second wiring layers 3 and 4 are formed by a second polycrystalline silicon layer 13A. The second polycrystalline silicon layer 13A can be formed in a so-called polycide structure. More particularly, it can be provided in a laminated structure of a polycrystalline silicon layer 13A with a metallic silicide layer 13B put thereon. The polycide layer is formed all over the surface and then subjected to selective etching by RIE or the like so that the above described grounding conductive layer 12 and the first wiring layers 1 and 2 are formed at the same time.

Then, as shown in FIG. 5A, a second interlayer insulating layer 14 is formed all over the surface, for example, by an $SiO_2$ layer by a CVD method the same as described above. Thereafter, as shown in FIG. 4C, contact windows are formed through the second and first interlayer insulating layers 11 and 14 for forming contacts $C_{22}$ and $C_{33}$, denoted by the same reference characters in FIG. 3, at the positions above the respective gate electrodes 8 of the transistors $Q_1$ and $Q_2$. Then, a third polycrystalline silicon layer 15 is formed all over the surface including the interior of these contact windows by, for example, a CVD method, and the layer is subjected to a patterning treatment so that a wiring layer 16 for forming high-resistance load resistors $R_1$ and $R_2$ and leading out a terminal $V_{cc}$ is formed. Then, a silicon nitride layer, i.e., an $Si_3N_4$ layer, is deposited by a reduced-pressure CVD method as an insulating layer 27 over the wiring layer 16 as shown in FIG. 5B.

The wiring layer 16 connected to the gate electrodes of the transistors $Q_1$ and $Q_2$ through the contacts $C_{22}$ and $C_{33}$ as described above is connected at the same time with the regions $d_{3b}$ and $d_{4b}$ of the transistors $Q_3$ and $Q_4$ through the contacts $C_2$ and $C_3$. Then, as shown in FIG. 2, a first silicate glass layer, an arsenic silicate glass layer 28, for example, is deposited on the insulating layer 27 to a thickness of approximately 5000 Å, and contact windows forming the contacts $C_8$ and $C_9$ as shown in FIG. 3 are made in the silicate glass layer at the positions above the extended ends of the first wiring layers 1 and 2 over the transistors $Q_{3S}$ and $Q_4$. Thereafter, the silicate glass layer 28 is subjected to a heat treatment, i.e., provided with a reflow treatment so that the surface is made into a gently-sloping surface. Then, second wiring layers 3 and 4 are formed through the contact windows for forming the contacts $C_8$ and $C_9$, put in contact with the first contact layers 1 and 2. These wiring layers 3 and 4 are formed by providing a first metallic layer by depositing a barrier metallic layer 29, for example, of a laminated structure of a Ti layer and a TiN layer to a thickness, for example, of 1000 Å and Al metal 30 put thereon to a thickness of 4000 Å by means of vaporization, sputtering, or the like, and then, by selectively etching the first metallic layer into desired patterns.

These second wiring layers 3 and 4 are extended opposite to each other in the extended direction of the later described bit lines. In the illustrated case, the contact $C_4$ is coincident with the contact $C_{22}$ when viewed from above.

Then, an under-coat 31 of $SI_3N_4$ for improving withstanding capability to voltage is deposited on the same by a plasma CVD method and further a second silicate glass layer, a phosphorous silicate glass layer 32, for example is deposited on the same to a thickness of 6000 Å or so.

Figure 6:
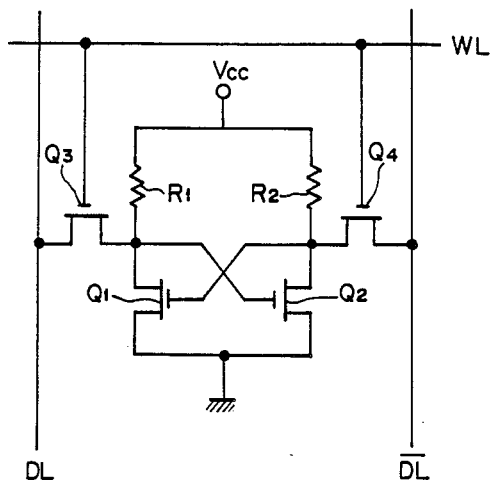
FIG. 6 is an equivalent circuit diagram of a high load resistance type S-RAM.

Further, contact windows for forming contacts $C_8$ and $C_9$, corresponding to the connections denoted by the same reference characters in FIG. 3, are made at the positions above the extended ends in the directions opposite to each other of the second wiring layers 3 and 4 through the second silicate glass layer 32 and the under-coat 31 thereunder, and then, a second metallic layer is formed including the interior of the contact windows consisting of a barrier metallic layer 33, for example, of a Ti layer 1000 Å or so thick and an Al metallic layer 34 of a thickness of 9000 Å put thereon. The layer is subjected to a predetermined patterning treatment by selective etching or the like, whereby the bit lines DL and $\overline{DL}$ as shown in FIG. 1 are formed. Over the same, a surface protecting layer 35, for example, of a thickness of 7500 Å is formed by a plasma CVD method. Thus, the S-RAM whose connection diagram is shown in FIG. 6 is fabricated.

Although, the case where the MIS transistors are of the n-channel type were illustrated above, they may be of the p-channel type, in which case the types of conduction at various points may be selected to be opposite to those illustrated above, or similarly, other modifications and changes may of course be made.

According to the present invention as described above, in a wiring structure made up, for example, of three layers of polycrystalline silicon layers, it is arranged such that electrical leading out from the diffused regions $d_{3a}$ and $d_{4a}$ of the MIS transistor $Q_3$ and $Q_4$ to the bit lines DL and $\overline{DL}$ provided by the metallic layer formed on the above described laminate structure are achieved by means of the first wiring layers 1 and 2 provided by the second polycrystalline silicon layer 13A as well as the second wiring layers 3 and 4 provided by the first metallic layer, whereby differences in level at stepped portions of contact are reduced so that occurrence of wire breakage is prevented and reliability on the device is improved. Also, it is arranged such that the wiring layers 1 and 2 are well as the wiring layers 3 and 4 are led out in the directions opposite to each other, and further, the wiring layers 1 and 2 are extended to the positions over the gate electrodes and the second wiring layers 3 and 4 are connected therewith at these positions, whereby the area for the arrangement can be reduced, and by virtue of avoiding juxtaposition of the wiring layers 3 and 4, the distance between the wirings 3 and 4 in the direction of the arrangement of the bit lines DL and $\overline{DL}$, i.e., in the direction of the width of the bit lines DL and $\overline{DL}$, can be sufficiently reduced so that increase in packaging density and improvement of reliability on the device can be achieved.

What is claimed is:

1. In a static RAM having a memory cell composed of a flip-flop circuit including a pair of MIS transistors and a pair of access transistors, said pair of access transistors beng connected with a pair of bit lines, said static RAM further comprising:

a pair of first wiring layers connected with diffusion regions of said pair of access transistors and extended to the positions over the gate electrodes of said access transistors; and a pair of second wiring layers connected with said pair of first wiring layers at the positions over the gate electrodes of said access transistors and led out opposite to each other in the extended direction of said pair of bit lines so as to be connected with said pair of bit lines, respectively.

2. In a static RAM having a memory cell composed of a flip-flop circuit including a pair of MIS transistors and a pair of access transistors, said pair of access transistors being connected with a pair of of bit lines, said static RAM further comprising:

a pair of first wiring layers connected with diffusion regions of said pair of access transistors, extended to the position over the gate electrode of one of said pair of access transistors, and extended to the position over the gate electrode of one of a pair of access transistors in a memory cell adjoining to the memory cell having said pair of access transistors; and a pair of second wiring layers connected with said pair of first wiring layers at the positions over the gate electrodes of said access transistors and led out opposite to each other in the extended direction of said pair of bit lines so as to be connected with said pair of bit lines, respectively.

3. A static RAM according to claim 1 or 2, wherein said first wiring layers are formed of a layer including a polysilicon layer.

4. A static RAM according to claim 1 or 2, wherein said second wiring layers are formed of a metallic wiring layer.

5. A static RAM according to claim 1 or 2, wherein said diffusion regions of said pair of access transistors connected with said first wiring layers are formed in common with diffusion regions of a pair of access transistors in an adjoining memory cell.

6. A static RAM according to claim 1 or 2, wherein said first wiring layer and said second wiring layer are connected through a barrier metallic layer.

7. A static RAM according to claim 1 or 2, wherein said second wiring layer and said bit line are connected through a barrier metallic layer.

8. A static RAM according to claim 1 or 2, wherein the gate electrodes of said pair of MIS transistors for said flip-flop circuit and the gate electrodes of said access transistors are formed in wiring on the first layer, said first wiring layers are formed in wiring on the second layer, resistor means for said flip-flop circuit are formed in wiring on the third layer, said second wiring layers are formed in wiring on the fourth layer, and said bit wires are formed in wiring on the fifth layer.

* * * * *